United States Patent
Ma et al.

(10) Patent No.: US 10,985,466 B2
(45) Date of Patent: *Apr. 20, 2021

(54) TERAHERTZ DETECTOR AND METHOD BASED ON N×M DIELECTRIC RESONANT ANTENNA ARRAY

(71) Applicant: Guangdong University of Technology, Guangzhou (CN)

(72) Inventors: Jianguo Ma, Guangzhou (CN); Shaohua Zhou, Guangzhou (CN)

(73) Assignee: Guangdong University of Technology, Guangzhou (CN)

( * ) Notice: Subject to any disclaimer, the term of this patent is extended or adjusted under 35 U.S.C. 154(b) by 9 days.

This patent is subject to a terminal disclaimer.

(21) Appl. No.: 16/297,691

(22) Filed: Mar. 10, 2019

(65) Prior Publication Data

US 2020/0203833 A1 Jun. 25, 2020

(30) Foreign Application Priority Data

Dec. 24, 2018 (CN) .......................... 201811582676.0

(51) Int. Cl.
*H01Q 9/04* (2006.01)
*H01L 23/66* (2006.01)
(Continued)

(52) U.S. Cl.
CPC .......... *H01Q 9/0407* (2013.01); *H01L 23/66* (2013.01); *H01Q 1/2283* (2013.01); *H01Q 9/16* (2013.01);
(Continued)

(58) Field of Classification Search
CPC . H01Q 1/50; H01Q 5/10; H01Q 11/12; H01Q 9/16; H01Q 9/0407; H01Q 21/065
(Continued)

(56) References Cited

U.S. PATENT DOCUMENTS

| 7,859,474 B1* | 12/2010 | Cripe | H03H 11/30 330/127 |
| 2007/0222697 A1* | 9/2007 | Caimi | H01Q 1/50 343/861 |

(Continued)

FOREIGN PATENT DOCUMENTS

CN 108180931 A 6/2018

OTHER PUBLICATIONS

Debin Hou et al. "130 GHz On-Chip Dielectric Resonator Antenna Array in CMOS Technology," 2017 Sixth Asia-Pacific Conference on Antennas and Propagation (APCAP), Jul. 26, 2018, 2 pages.

*Primary Examiner* — Tung X Le (57) ABSTRACT

The present disclosure discloses a terahertz detector based on a N×M dielectric resonant antenna array, wherein a N×M on-chip dielectric resonant terahertz antenna array is connected to a matching network, the matching network is connected to a source of a NMOSFET, a gate of the NMOSFET is sequentially connected to a first bias resistor and a first bias voltage, a third transmission line is connected between the first bias resistor and the gate, a drain of the NMOSFET is connected to a first DC blocking capacitor, the other end of the first DC blocking capacitor is connected to a low noise preamplifier, a second bias resistor and a second bias voltage are further connected between the first DC blocking capacitor and the low noise preamplifier, and the low noise preamplifier is further provided with a voltage feedback loop. The present disclosure also discloses a design method for the same.

9 Claims, 7 Drawing Sheets

(51) Int. Cl.
   *H01Q 1/22*    (2006.01)
   *H01Q 9/16*    (2006.01)
   *H01Q 21/06*   (2006.01)
   *H01Q 23/00*   (2006.01)

(52) U.S. Cl.
   CPC ........... *H01Q 21/065* (2013.01); *H01Q 23/00* (2013.01); *H01L 2223/6655* (2013.01); *H01L 2223/6677* (2013.01)

(58) Field of Classification Search
   USPC ....................................... 343/850, 860, 865
   See application file for complete search history.

(56) References Cited

U.S. PATENT DOCUMENTS

| | | | | |
|---|---|---|---|---|
| 2009/0046030 | A1* | 2/2009 | Song | H03J 3/06 343/852 |
| 2011/0086600 | A1* | 4/2011 | Muhammad | H04B 1/0458 455/120 |
| 2011/0248900 | A1* | 10/2011 | de Rochemont | H01Q 5/15 343/803 |
| 2015/0091776 | A1* | 4/2015 | Gaynor | H04B 1/18 343/860 |
| 2017/0146591 | A1* | 5/2017 | Nobbe | G01R 31/2856 |

* cited by examiner

TERAHERTZ DETECTOR AND METHOD BASED ON N×M DIELECTRIC RESONANT ANTENNA ARRAY

CROSS-REFERENCE TO RELATED APPLICATION

This application claims the priority to Chinese Patent Application No. 201811582676.0 filed on Dec. 24, 2018. The content of the aforementioned application, including any intervening amendments thereto, are incorporated herein by reference.

TECHNICAL FIELD

The present disclosure relates to the field of terahertz technology, and in particular to a terahertz detector and method based on a N×M dielectric resonant antenna array.

BACKGROUND

THz radiation (T-ray) generally refers to an electromagnetic wave having a frequency in the range of 0.1 THz to 10 THz (wavelength in the range of 30 μm to 3 mm), and its long wavelength-band direction coincides with the millimeter wave (sub-millimeter wave), and its short wavelength-band direction coincides with the infrared ray. Therefore, it belongs to the far infrared wave band.

Since the THz wave is in the position of a special electromagnetic spectrum, it has many superior characteristics and has great scientific significance. It mainly embodies in the following aspects. Firstly, its quantum energy and blackbody temperature are very low. Since the photon energy of the terahertz wave is very low, it is not easily ionized when it penetrates a substance, and thus it can be used for safe non-destructive detection. Secondly, many substance macromolecules, such as biomacromolecules, have vibration and rotational frequencies in the THz wave band, so they exhibit strong absorption and resonance in the THz wave band. For example, many explosives have "terahertz fingerprinting" characteristics, which allow them to be identified from clothing and when mixed with other materials, such as the detection of narcotics/drugs. The strongly permeable THz wave can penetrate substances such as ceramics, fat, carbon sheets, cloth, plastics and the like with little attenuation. Therefore, it can be used to detect a variety of low-concentration polarized gases, and is suitable for special fields such as environmental protection and military chemical reconnaissance. Thirdly, the advantages of applying the terahertz technology in environmental monitoring, protection, national security and anti-terrorism, and so forth, can make up for the shortcomings of the infrared technology and microwave technology. In addition, the terahertz wave is in the blank area between the microwave millimeter wave and the infrared wave band and between the electronics and the photonics. It is also a blank area of human science and technology, and has a very broad development space. Therefore, the active research work of THz science and technology is of strategic importance, and the terahertz detector, which is the basis of terahertz application, is a critical component of terahertz security and detection.

At present, terahertz detection based on N-type Metal-Oxide-Semiconductor Field-Effect Transistor (NMOSFET) has proved to be very feasible, but due to Complementary Metal Oxide Semiconductor (CMOS) process limitations, the larger loss of conventional terahertz antennas such as on-chip dipoles and patches in terahertz detectors leads to the narrower impedance matching bandwidth of the conventional terahertz antenna such as on-chip dipoles and patches, which greatly affects the detection sensitivity of the terahertz detector. However, the current development trend of terahertz detectors is high sensitivity. Therefore, it is a hot research topic to develop an on-chip terahertz antenna with low loss and wide impedance matching bandwidth based on the CMOS compatible technology to achieve high sensitivity terahertz detection.

The present disclosure innovatively introduces a N×M on-chip dielectric resonant terahertz antenna array into a NMOSFET-based terahertz detector, and achieves higher gain and wider impedance matching bandwidth for the on-chip terahertz antenna in comparison with conventional NMOSFET terahertz detectors based on terahertz antennas such as on-chip dipoles and patches or a single on-chip dielectric resonant terahertz antenna.

SUMMARY

A main object of the present disclosure is to provide a NMOSFET terahertz detector and method based on a N×M dielectric resonant antenna array, which is intended to reduce the loss of the on-chip terahertz antenna and improve the gain and radiation efficiency of the on-chip terahertz antenna, improving the detection sensitivity of the NMOSFET terahertz detector.

To achieve the above object, the present disclosure proposes a NMOSFET terahertz detector based on a N×M dielectric resonant antenna array, comprising a N×M on-chip dielectric resonant terahertz antenna array, wherein N is the number of rows in the array, M is the number of columns in the array and the N and the M are positive integers, wherein the N×M on-chip dielectric resonant terahertz antenna array is connected to a matching network, the matching network is connected to a source of a NMOSFET, a gate of the NMOSFET is sequentially connected to a first bias resistor and a first bias voltage, a transmission line is connected between the first bias resistor and the gate, a drain of the NMOSFET is connected to a first Direct Current (DC) blocking capacitor, the other end of the first DC blocking capacitor is connected to a low noise preamplifier, a second bias resistor and a second bias voltage are further connected between the first DC blocking capacitor and the low noise preamplifier, and the low noise preamplifier is further provided with a voltage feedback loop.

Preferably, the N×M on-chip dielectric resonant terahertz antenna array is an array structure consisting of N×M on-chip H-shaped slot structures, each of the on-chip H-shaped slot structures is connected at the surface with a rectangular dielectric resonator block through an insulating adhesive layer, and a connection slot extending outwardly of each of the on-chip H-shaped slot structures is sequentially connected to the connection slots of adjacent on-chip H-shaped slot structures and form a non-overlapping power division network ring, the power division network ring being provided with two parallel antenna-sections connected to the outside.

Preferably, when the N and the M are even, a connection port of the connection slot of the uppermost on-chip H-shaped slot structure and a connection port of the connection slot of the lowermost on-chip H-shaped slot structure have a phase difference of 180°.

Preferably, the on-chip H-shaped slot structures are formed on a surface of an integrated process top layer metal and is located within a metal cavity formed by stacking intermediate layer metals, other than the integrated process top layer metal and an integrated process bottom layer metal in an integrated process, and metal vias.

Preferably, the on-chip H-shaped slot structure comprises a left vertical slot and a right vertical slot arranged in parallel, opposite sides of the left vertical slot and the right vertical slot are connected to an inverted L-shaped left side slot and right side slot, respectively, a horizontal portion of the left side slot is connected in the middle of the left vertical slot, a horizontal portion of the right side slot is connected in the middle of the right vertical slot, and vertical portions of the left side slot and the right side slot are parallel to each other and constitute two lead-out slots for connecting the antenna to an outside structure.

Preferably, the matching network comprises a first transmission line connected to the on-chip dielectric resonant terahertz antenna and the source respectively at both ends, a middle portion of the first transmission line is connected to one end of a second transmission line, and the other end of the second transmission line is grounded.

Preferably, the voltage feedback loop comprises a first resistor connected to two ends of the low noise preamplifier, a left end of the first resistor connected to a negative terminal of the low noise preamplifier is sequentially connected to a second resistor, a second DC blocking capacitor and the ground, and a right end of the first resistor is also sequentially connected to a third DC blocking capacitor and the ground.

The present disclosure further proposes a method of designing the N×M on-chip dielectric resonant terahertz antenna array, wherein N is the number of rows in the array, M is the number of columns in the array and the N and the M are positive integers, comprising steps of:

S1: with a resonance mode being in $TE_{m,\delta,n}$ mode, calculating 3D dimensions of the rectangular dielectric resonator block by solving a transcendental equation, the transcendental equation being:

$$k_y \tan\left(\frac{k_y W_{DRA}}{2}\right) = \sqrt{(\varepsilon_r - 1)k_{mn}^2 - k_y^2} \quad (1)$$

where $$k_{mn} = \frac{2\pi f_{mn}}{c}, k_x = m\frac{\pi}{L_{DRA}}, k_z = n\frac{\pi}{2H_{DRA}}, k_x^2 + k_y^2 + k_z^2 = \varepsilon_r k_{mn}^2 \quad (2)$$

c is the speed of light, $\varepsilon_r$ is a relative dielectric constant and $f_{mn}$ is the operating frequency of the rectangular dielectric resonator block in this mode $TE_{m,\delta,n}$;

wherein m, n and δ are the number of electromagnetic waves generated in the x, y, z directions, and are integers;

wherein $k_y$ is the component of the propagation constant of electromagnetic waves in the medium in the y direction, and $k_{mn}$ is the propagation constant of electromagnetic waves in the medium, wherein $k_x$ and $k_z$ are the components of the propagation constant in the x and z directions when electromagnetic waves propagate in the medium;

wherein $W_{DRA}$ is the width of the medium in the x direction, $L_{DRA}$ is the length of the medium in the y direction and, $H_{DRA}$ is the height of the medium in the z direction;

S2: in a process of designing an on-chip excitation structure, selecting a top layer metal Metal6 to design a H-shaped slot structure while selecting a bottom layer metal Metal1 as a metal base plate, and stacking intermediate metal layers and metal vias to form a metal shielding cavity around the H-shaped slot structure;

S3: selecting a suitable insulating adhesive layer to combine the rectangular dielectric resonator block and the on-chip H-shaped slot structure;

S4: adopting a Grounded Coplanar Waveguide(GCPW) transmission line structure composed of the top layer metal Metal6 and the bottom layer metal Metal1 to design a power division network, and then optimizing parameters by means of High Frequency Structure Simulator (HFSS) software so as to meet impedance matching and port phase requirements of the GCPW power division network;

S5: performing co-simulation and optimization of the GCPW power division network with the N×M on-chip dielectric resonant terahertz antenna array.

Preferably, in the S1, the resonance mode of the rectangular dielectric resonator block is selected to be $TE_{1,\delta,3}$ mode of high-order resonant modes, and the transcendental equation is solved by programming with mathematical software Matlab, to obtain the 3D dimensions of the rectangular dielectric resonator block at a frequency of 300 GHz being $W_{DR}$=250 μm, $L_{DR}$=250 μm, $H_{DR}$=400 μm, respectively; in the S2, the dimensions of the H-shaped slot structure are $l_1$=70 μm, $l_2$=220 μm, $w_s$=9.5 μm, $w_1$=15 μm, $w_2$=10 μm, $w_3$=10 μm; and the insulating adhesive layer mentioned in the step S3 is selected as a thermal stability insulating adhesive having a relative dielectric constant of 2.4 and a thickness of 10/m.

The technical solution according to the present disclosure has the following advantages over the prior art.

The technical solution according to the present disclosure combines a rectangular dielectric resonator block in $TE_{1,\delta,3}$ mode of high-order modes with low loss characteristics and an on-chip slot feed structure, so as to design a N×M on-chip dielectric resonant terahertz antenna array, and the optimization of the impedance matching through a GCPW power division network and the superposition of vibration source antennas in the space electromagnetic field can effectively overcome the technical problem of low gain and narrow impedance matching bandwidth for the on-chip terahertz antenna existed when designing the on-chip terahertz antenna. Compared with the conventional NMOSFET terahertz detectors based on terahertz antennas such as on-chip dipoles and patches or a single on-chip dielectric resonant terahertz antenna, the technical solution of the present disclosure achieves higher gain and wider impedance matching bandwidth for the on-chip terahertz antenna, and improves the detection sensitivity of the NMOSFET terahertz detector.

The output voltage signal of the NMOSFET terahertz detector of the technical solution according to the present disclosure is a DC voltage signal, and the magnitude of the DC voltage signal is proportional to the radiation intensity of the terahertz signal. The intensity information of the incident terahertz signal can be obtained according to the magnitude of the output voltage signal of the terahertz detector, thereby realizing terahertz detection, so that the technical problem that the existing terahertz antenna has low gain and narrow impedance matching bandwidth for the on-chip terahertz antenna is effectively solved, ultimately achieving a terahertz detection with high sensitivity.

BRIEF DESCRIPTION OF THE DRAWINGS

In order to more clearly illustrate the technical solutions in embodiments of the present disclosure or the prior art, the accompanying drawings needed to be used in the description of the embodiments or the prior art will be briefly described below. Obviously, the accompanying drawings in the following description are only some embodiments of the present disclosure, and other accompanying drawings can be obtained by ordinary persons skilled in the art from the structures illustrated in these accompanying drawings without any inventive efforts.

DESCRIPTION OF THE REFERENCE NUMERALS

| No. | Name |
| --- | --- |
| 1 | First bias voltage |
| 2 | First bias resistor |
| 3 | NMOSFET |
| 31 | Source |
| 32 | Drain |
| 33 | Gate |
| 4 | 2 × 2 on-chip dielectric resonant terahertz antenna array |
| 41 | First on-chip H-shaped slot structure |
| 411 | First left connection slot |
| 412 | First right connection slot |
| 413 | Left vertical slot |
| 414 | Right vertical slot |
| 415 | Left side slot |
| 416 | Right side slot |
| 42 | Second on-chip H-shaped slot structure |
| 421 | Second left connection slot |
| 422 | Second right connection slot |
| 43 | Third on-chip H-shaped slot structure |

-continued

| No. | Name |
| --- | --- |
| 431 | Third left connection slot |
| 432 | Third right connection slot |
| 44 | Fourth on-chip H-shaped slot structure |
| 441 | Fourth left connection slot |
| 442 | Fourth right connection slot |
| 45 | Top layer metal |
| 46 | Insulating adhesive layer |
| 47 | Rectangular dielectric resonator block |
| 48 | Metal cavity |
| 49 | Bottom layer metal |
| 5 | Matching network |
| 51 | First transmission line |
| 52 | Second transmission line |
| 6 | First DC blocking capacitor |
| 7 | Second bias voltage |
| 8 | Second bias resistor |
| 9 | Low noise preamplifier |
| 10 | First resistor |
| 11 | Second resistor |
| 12 | Second DC blocking capacitor |
| 13 | Grounding |
| 14 | Third DC blocking capacitor |
| 15 | Third transmission line |

The implementation, functional features and advantages of the present disclosure will be further described in the light of embodiments with reference to the accompanying drawings.

DETAILED DESCRIPTION

The technical solutions according to the embodiments of the present disclosure are clearly and completely described in the following with reference to the accompanying drawings of the embodiments of the present disclosure. Obviously, the described embodiments are only a part of the embodiments of the present disclosure, and not all the embodiments. All other embodiments obtained by ordinary persons skilled in the art based on the embodiments of the present disclosure without creative efforts are within the scope of the present disclosure.

It should be noted that if there is a directional indication (such as up, down, left, right, front, back, . . . ) mentioned in the embodiments of the present disclosure, the directional indication is only used to explain the relative positional relationship between components, motion status, and the like in a specific posture (as shown in the drawing), and if the specific posture changes, the directional indication also changes accordingly.

In addition, if there is a description of "first", "second", etc. in the embodiments of the present disclosure, the description of the "first", "second", etc. is used for the purpose of illustration only, and is not to be construed as an its relative importance or implicit indication of the number of technical features indicated. Thus, the features defined by "first" or "second" may include at least one of the features, either explicitly or implicitly. In addition, the technical solutions among the various embodiments may be combined with each other, but must be based on the enablement of those skilled in the art, and when the combination of the technical solutions is contradictory or impossible to implement, it should be considered that such combination of technical solutions does not exist, and is not within the scope of protection claimed by the present disclosure.

The present disclosure proposes a NMOSFET terahertz detector based on a N×M dielectric resonant antenna array and a design method for the N×M on-chip dielectric resonant terahertz antenna array.

Figure 1:
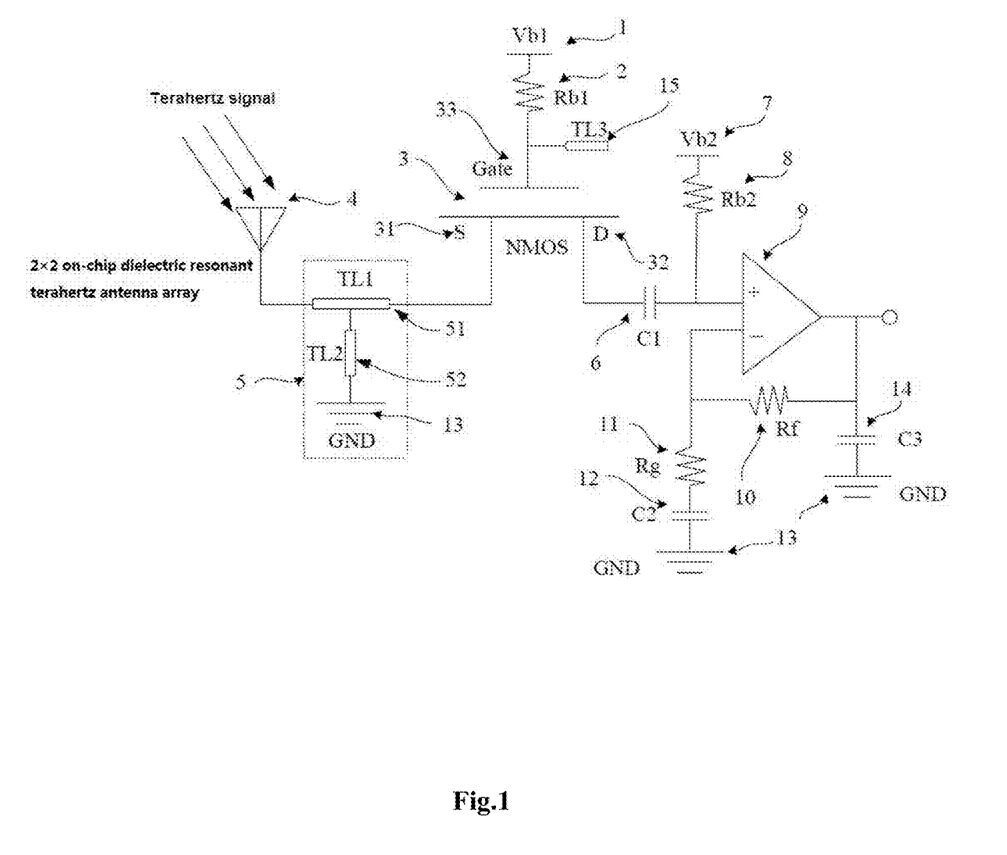
FIG. 1 is a schematic structural view of a NMOSFET terahertz detector based on a 2×2 dielectric resonant terahertz antenna array according to an embodiment of the present disclosure.

Referring to FIG. 1, a specific embodiment of the present disclosure is described in detail by taking a NMOSFET terahertz detector based on a 2×2 dielectric resonant antenna array as an example. The NMOSFET terahertz detector based on a 2×2 dielectric resonant antenna array comprises a 2×2 on-chip dielectric resonant terahertz antenna array 4. The 2×2 on-chip dielectric resonant terahertz antenna array 4 is connected to a matching network 5, and further the matching network 5 is connected to a source 31 of a NMOSFET 3. A gate 33 of the NMOSFET 3 is sequentially connected to a first bias resistor 2 and a first bias voltage 1. An open-end quarter-wavelength third transmission line 15 is connected between the gate 33 and the first bias resistor 2. A drain 32 of the NMOSFET 3 is connected to a first DC blocking capacitor 6, and the other end of the first DC blocking capacitor 6 is connected to a low noise preamplifier 9. A second bias resistor 8 is connected between the first DC blocking capacitor 6 and the low noise preamplifier 9, and the other end of the second bias resistor 8 is connected to the first bias voltage 7 so as to provide a DC power supply to the low noise preamplifier 9. In addition, the low noise preamplifier 9 is also connected to a voltage feedback loop.

Figure 2:
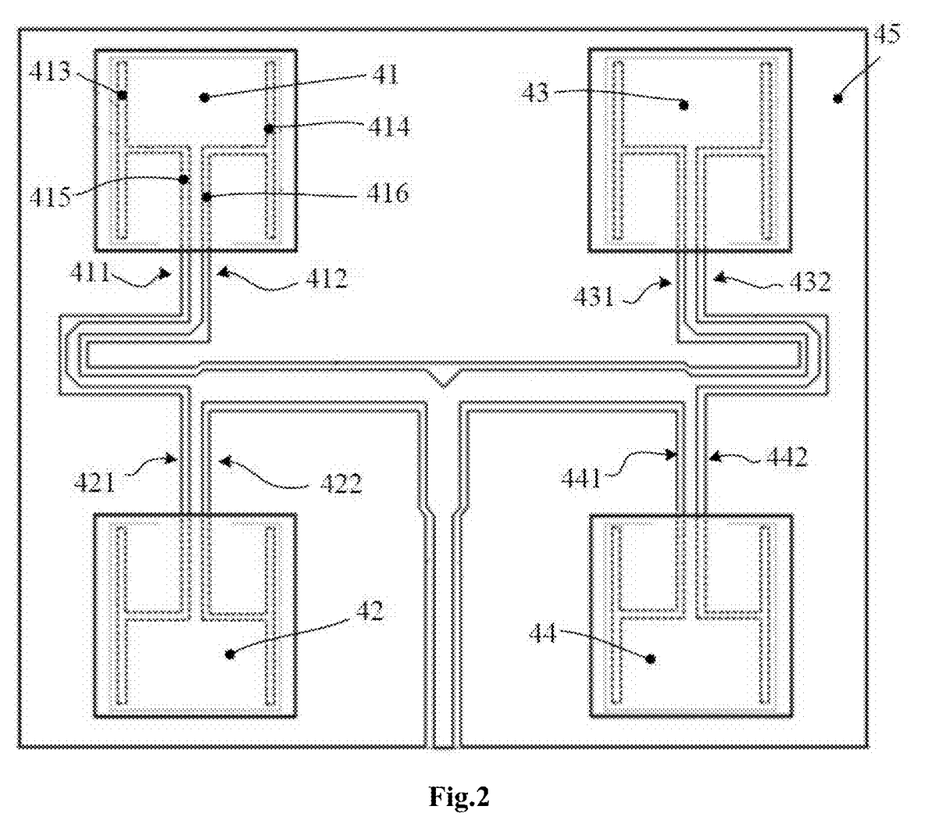
FIG. 2 is a schematic structural view of a 2×2 on-chip dielectric resonant terahertz antenna array according to an embodiment of the present disclosure.
Figure 3:
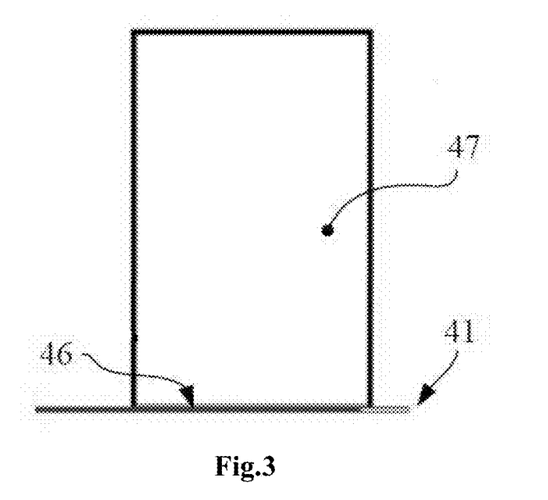
FIG. 3 is a schematic structural view of an on-chip dielectric resonant terahertz antenna unit according to an embodiment of the present disclosure.
Figure 4:
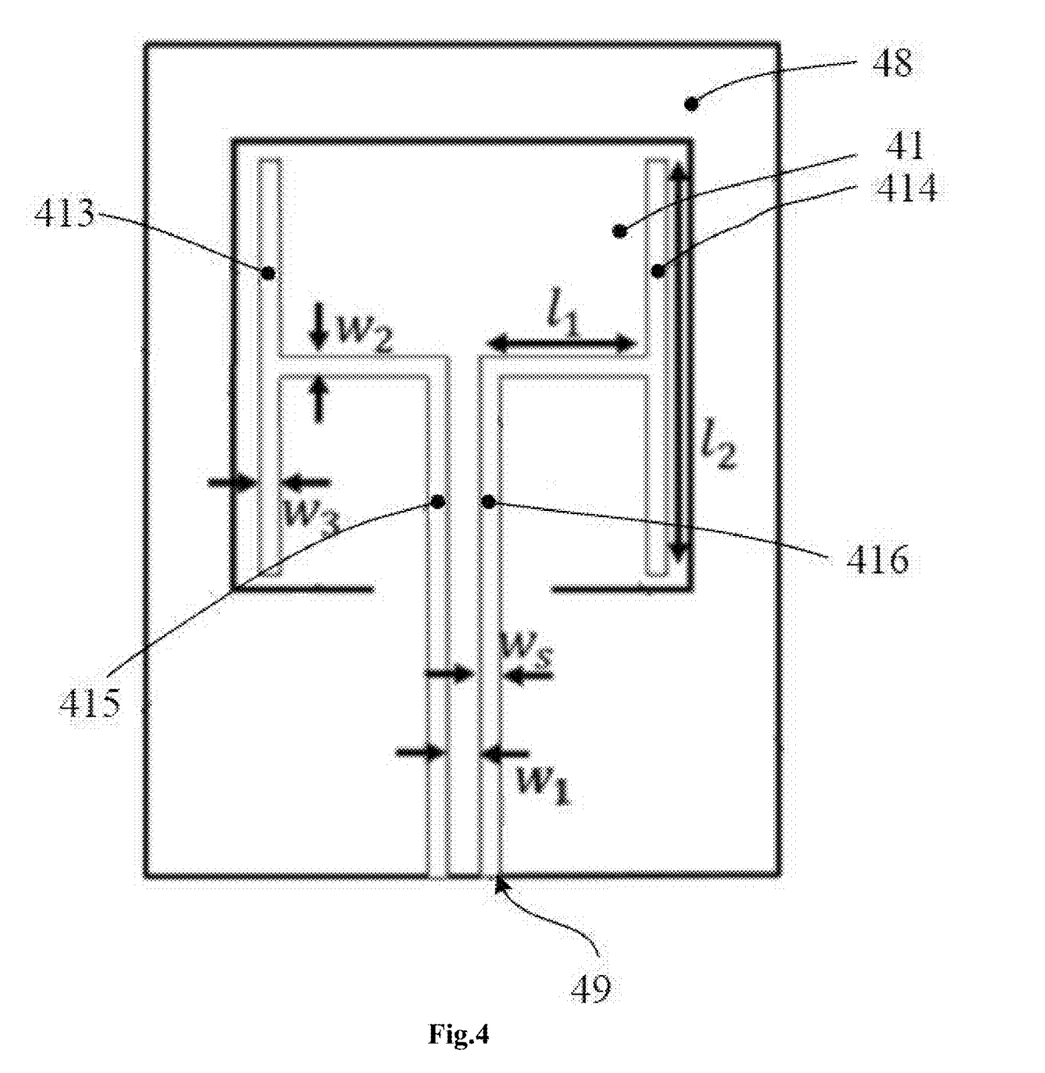
FIG. 4 is a schematic structural view of an on-chip H-shaped slot structure according to an embodiment of the present disclosure.

Referring to FIGS. 2 to 4, the 2×2 on-chip dielectric resonant terahertz antenna array 4 of the present embodiment is a 2×2 antenna array formed on a rectangular integrated process top layer metal 45. The 2×2 on-chip dielectric resonant terahertz antenna array 4 comprises four on-chip H-shaped slot structures 41, 42, 43 and 44 having the same structure, which are formed at four ends of the rectangular integrated process top layer metal 45, respectively. The four on-chip H-shaped slot structures 41, 42, 43 and 44 are connected to four rectangular dielectric resonator blocks 47 having the same structure through insulating adhesive layers 46, respectively. Herein, a first left connection slot 411 on the left side of the first on-chip H-shaped slot structure 41 at the upper left end portion is connected to a second left connection slot 421 on the left side of the second on-chip H-shaped slot structure 42 at the lower left end portion, and a first right connection slot 412 on the right side of the first on-chip H-shaped slot structure 41 is connected to a third left connection slot 431 on the left side of the third on-chip H-shaped slot structure 43 at the upper right end portion. A third right connection slot 432 on the right side of the third on-chip H-shaped slot structure 43 is connected to a fourth right connection slot 442 on the right side of the fourth on-chip H-shaped slot structure 44 at the lower right end portion. A second right connection slot 422 on the right side of the second on-chip H-shaped slot structure 42 and a fourth left connection slot 441 on the left side of the fourth on-chip H-shaped slot structure 44 extend outwardly and constitute a connection port for connecting an external circuit of the antenna array. That is, the connection slots extending outwardly of each of the on-chip H-shaped slot structures 41, 42, 43, 44 are sequentially connected with the connection slots of its adjacent on-chip H-shaped slot structures to form a non-overlapping 4-way GCPW power division network ring. The power division network ring is provided with two parallel antenna-sections connected to the outside.

Figure 5:
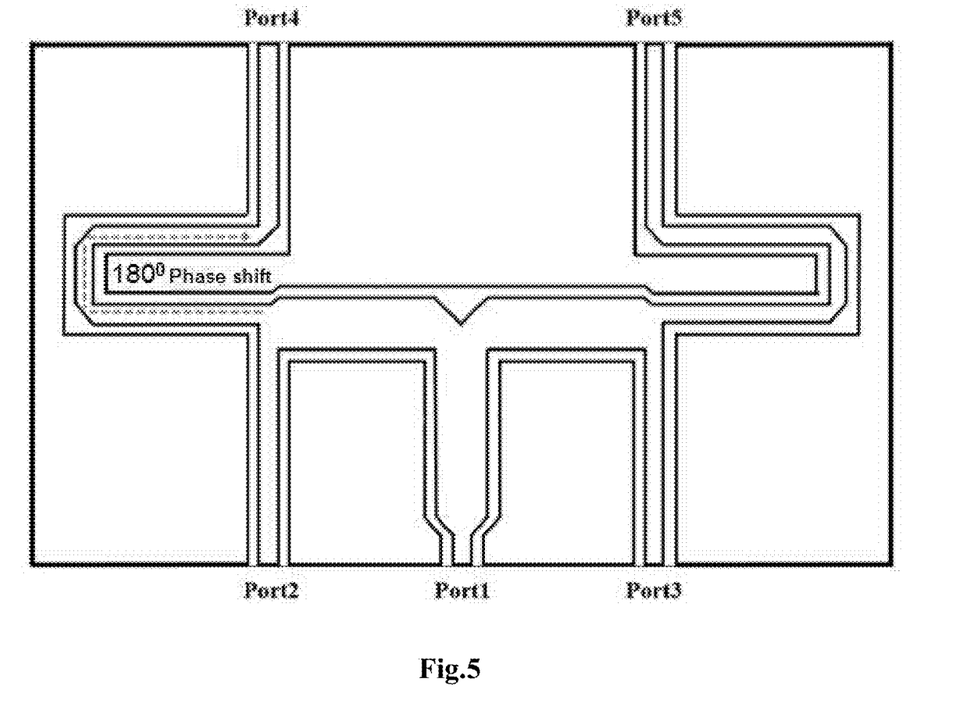
FIG. 5 is a schematic structural view of a 4-way GCPW power division network in FIG. 2.

As shown in FIG. 2 and FIG. 5, N and M of the NMOSFET terahertz detector based on the N×M dielectric resonant antenna array of the technical solution of the present disclosure are both positive integers. When the N and the M are both even, a connection port of the connection slot of the uppermost on-chip H-shaped slot structure and a connection port of the connection slot of the lowermost on-chip H-shaped slot structure have a phase difference of 180°. As shown in FIG. 5 of the embodiment, the phase differences between each of the connection port 4 and the connection port 5, and any one of the connection port 1, the connection port 2 and the connection port 3 are 180°, and the phase differences of 180° are set to increase the antenna array gain in a fixed direction and improve matching performance of the antenna.

Referring to FIG. 2 and FIG. 4, the four on-chip H-shaped slot structures 41 having the same structure of the present embodiment comprises a left vertical slot 413 and a right vertical slot 414 formed in parallel. Opposite sides of the left vertical slot 413 and the right vertical slot 414 are formed with an inverted L-shaped left side slot 415 and right side slot 416, respectively. The horizontal portions of the inverted L-shaped left side slot 415 and right side slot 416 are connected in the middle of the left vertical slot 413 and the right vertical slot 414, and the vertical portion of the inverted L-shaped left side slot 415 is connected to the first left connection slot 411. The specific structures of the on-chip H-shaped slot structures 41, 42, 43 and 44 are shown in FIG. 2, and detailed description thereabout is omitted herein.

Referring to FIG. 4, additionally, the on-chip H-shaped slot structures 41, 42, 43 and 44 of the present embodiment are formed on a surface of the integrated process top layer metal 45 and is located within a metal cavity 48 formed by stacking intermediate layer metals, other than the integrated process top layer metal 45 and an integrated process bottom layer metal 49 in an integrated process, and metal vias.

Preferably, the on-chip H-shaped slot structures 41, 42, 43 and 44 of the present embodiment are designed and processed using a silicon-based process so as to excite the rectangular dielectric resonator block 47 overlying it and optimize the impedance matching effect. In addition, the insulating adhesive layer 46 has good thermal stability for fixing the rectangular dielectric resonator block 47 to a surface of the on-chip excitation structure.

More preferably, the rectangular dielectric resonator block of the present embodiment has a larger relative dielectric constant, for example, a relative dielectric constant of >5, so that the insulating material is processed into a specific size to couple and radiate an electromagnetic field to the space. In addition, the rectangular dielectric resonance mode of the present embodiment is a $TE_{1,\delta,3}$ mode.

In this embodiment, the center frequency of the 2×2 on-chip dielectric resonant terahertz antenna array 4 is 300 GHz, and magnesium oxide having a relative dielectric constant of 9.65 is selected as the material of the rectangular dielectric resonator block 47. A parameter (Towerjazz SBC18H3) of the 0.18mGeSi BiCMOS process is selected to design the on-chip structure, and there are six layers of metal Metal1-Metal6 and five layers of metal vias Via1-Via5 in this process.

Referring to FIG. 1, the matching network 5 of the present embodiment comprises a first transmission line 51, of which two ports are connected to a 2×2 on-chip dielectric resonant terahertz antenna array 4 and a source, respectively. The middle portion of the first transmission line 51 is connected to an end of a second transmission line 52, and the other end of the second transmission line 52 is grounded. The matching network 5 is composed of two microstrip transmission lines, the first transmission line 51 and the second transmission line 52. The matching network 5 is mainly used to improve the power transmission efficiency between the antenna and the transistor, and a DC power supply is provided for the source 31 of the transistor. The left end of the microstrip first transmission line 51 is connected to the 2×2 on-chip dielectric resonant terahertz antenna array 4, and the right end of the microstrip first transmission line 51 is connected to the source 31 of the NMOSFET 3.

The gate 33 of the NMOSFET 3 of the present embodiment is loaded with a fixed first bias voltage 1 and a first bias resistor 2, and an open-end quarter-wavelength third transmission line 53 is connected between the gate 33 of the NMOSFET and the first bias resistor 2. The open-end quarter-wavelength third transmission line 53 is mainly used to eliminate the influence of the gate DC bias on the impedance matching between the antenna and the transistor.

In the present embodiment, a first DC blocking capacitor 6, a second bias voltage 7, and a second bias resistor 8 are connected between the drain 32 of the NMOSFET 3 and the forward input terminal of the low noise preamplifier 9, wherein the second bias voltage 7 and the second bias resistor 8 are used for supplying power to the low noise preamplifier 9.

The voltage feedback loop of the present embodiment comprises a first resistor 10 connected to two ends of the low noise preamplifier 9, a left end of the first resistor 10 connected to a negative terminal of the low noise preamplifier 9 is sequentially connected to a second resistor 11, a second DC blocking capacitor 12 and the ground, and a right end of the first resistor 10 is also sequentially connected to a third DC blocking capacitor 14 and the ground. The voltage feedback loop of the low noise preamplifier 9 is mainly composed of the first resistor 10, the second resistor 11, the second DC blocking capacitor 12 and the third DC blocking capacitor 14, wherein the gain of the low noise preamplifier 9 can be adjusted by changing the resistance values of the first resistor 10 and the second resistor 11.

Referring to FIG. 6 to FIG. 11, the design of the 2×2 on-chip dielectric resonant terahertz antenna array 4 specifically comprises the following design steps.

Figure 6:
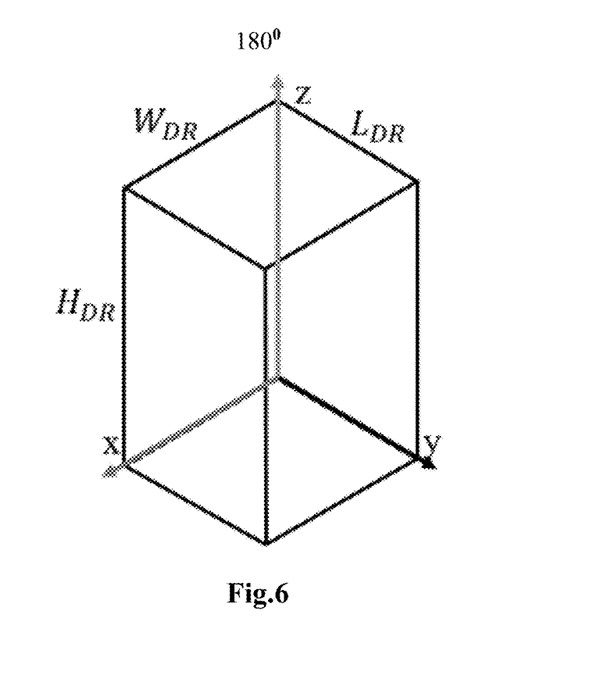
FIG. 6 is a schematic structural view of a rectangular dielectric resonator block according to an embodiment of the present disclosure.

1. Design of rectangular dielectric resonator block. The resonant mode is in $TE_{m,\delta,n}$ mode, and the dimensions of the rectangular dielectric resonator block as shown in FIG. 6 can be calculated by solving the transcendental equation (1):

$$k_y \tan\left(\frac{k_y W_{DRA}}{2}\right) = \sqrt{(\varepsilon_r - 1)k_{mn}^2 - k_y^2} \quad (1)$$

$$k_{mn} = \frac{2\pi f_{mn}}{c}, \quad k_x = m\frac{\pi}{L_{DRA}}, \quad k_z = n\frac{\pi}{2H_{DRA}}, \quad k_x^2 + k_y^2 + k_z^2 = \varepsilon_r k_{mn}^2 \quad (2)$$

where Equations (2) is the explanation for parameters of the equation (1), wherein c is the speed of light, and $f_{mn}$ is the operating frequency of the rectangular dielectric resonator block in this mode. The $TE_{1,\delta,3}$ mode of high-order resonant modes is selected as the resonant mode of the rectangular dielectric resonator block in the embodiment of the present disclosure, and has a higher gain than the base mode. The transcendental equation (1) is solved by programming with the mathematical software Matlab, obtaining the dimensions of the rectangular dielectric resonator block at 300 GHz as: $W_{DR}$=250 μm, $L_{DR}$=250 μm, $H_{DR}$=400 μm.

2. Design of on-chip excitation structure. The on-chip H-shaped slot structure is shown in FIG. 4. In the design process, the top layer metal Metal6 is selected to design the slot structure, while the bottom layer metal Metal1 is selected as the metal base plate to suppress the electromagnetic wave from propagating toward a high-loss silicon substrate, and the intermediate metal layer and metal vias are stacked to form a metal shield cavity around the H-shaped slot structure, to suppress electromagnetic leakage and reduce loss.

The dimension parameters of the H-shaped slot structure are:

$l_1$=70 μm, $l_2$=220 μm, $w_s$=9.5 μm, $w_1$=15 μm, $w_2$=10 μm, $w_3$=10 μm

3. Selection of the insulating adhesive layer 42. The insulating adhesive layer 42 is made of a thermally stable insulating adhesive having a relative dielectric constant of 2.4 and a thickness of 10 μm, for bonding the rectangular dielectric resonator block 43 and the on-chip H-shaped slot structure 41.

Figure 7:
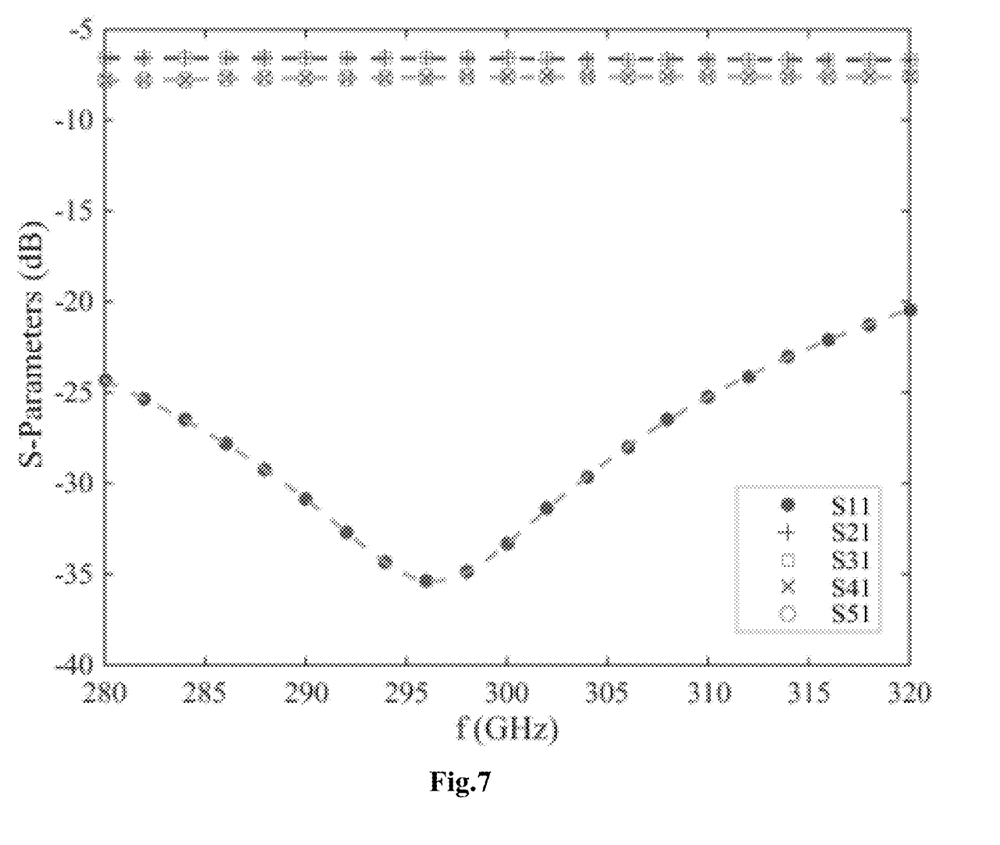
FIG. 7 is a graph showing the S parameter of a 4-way GCPW power division network according to an embodiment of the present disclosure as a function of frequency.
Figure 8:
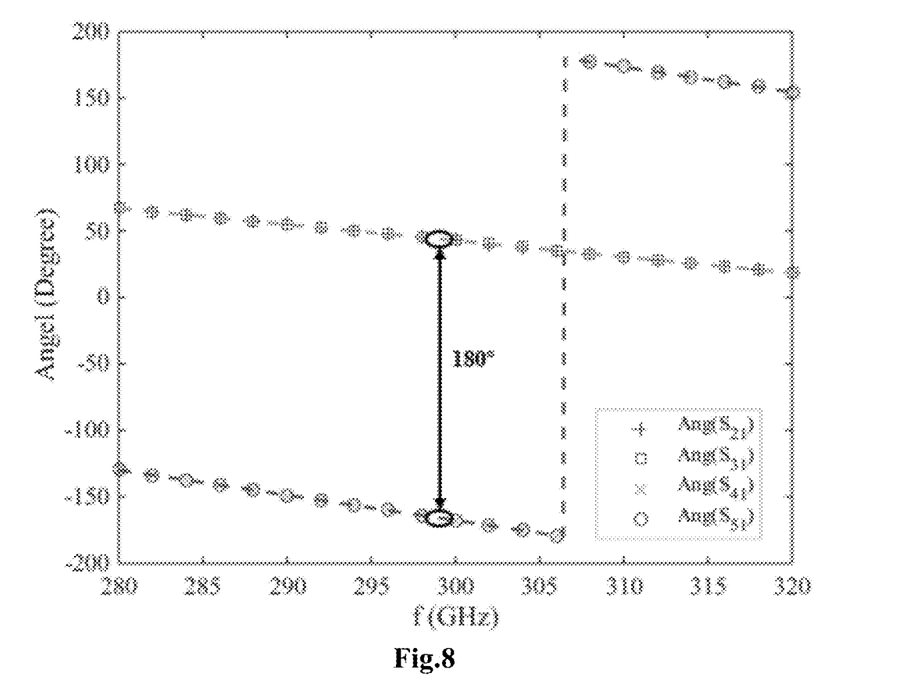
FIG. 8 is a graph showing the phases between ports of a 4-way GCPW power division network according to an embodiment of the present disclosure as a function of frequency.

4. Design of a 4-way GCPW power division network. A GCPW transmission line structure composed of the top layer metal Metal6 and the bottom layer metal Metal1 is adopted to design a 4-way power division network, and then parameters is optimized by means of HFSS software so as to meet impedance matching and port phase requirements of the GCPW power division network. FIG. 7 is a graph showing the S-parameter of the 4-way GCPW sub-network as a function of frequency. FIG. 8 is a graph showing the phases between the ports of the 4-way GCPW sub-network as a function of frequency.

Figure 9:
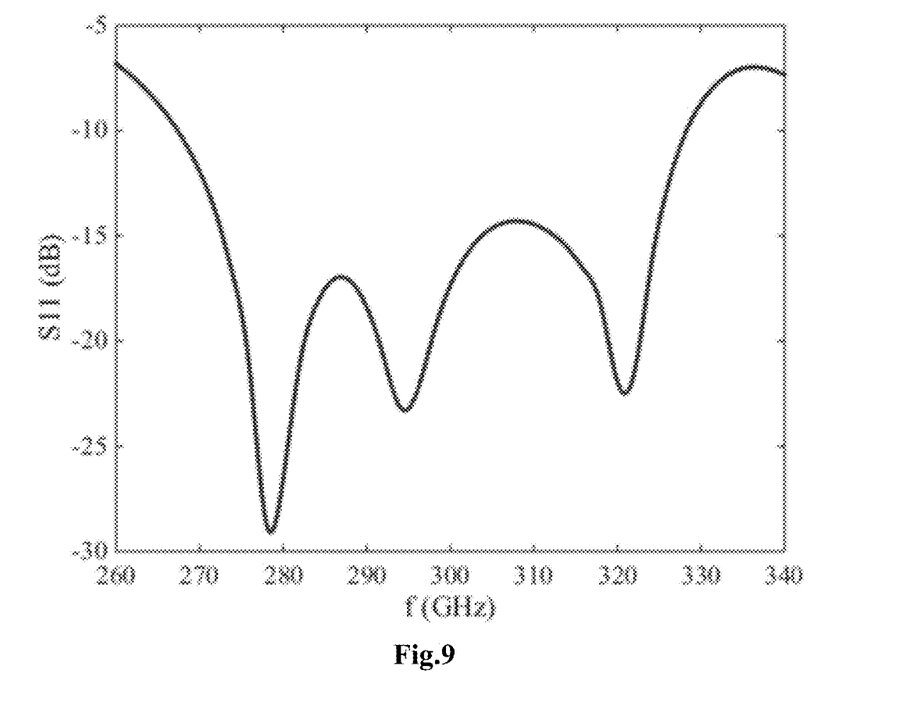
FIG. 9 is a graph showing the return loss S11 of a 2×2 on-chip dielectric resonant terahertz antenna array according to an embodiment of the present disclosure as a function of frequency.
Figure 10:
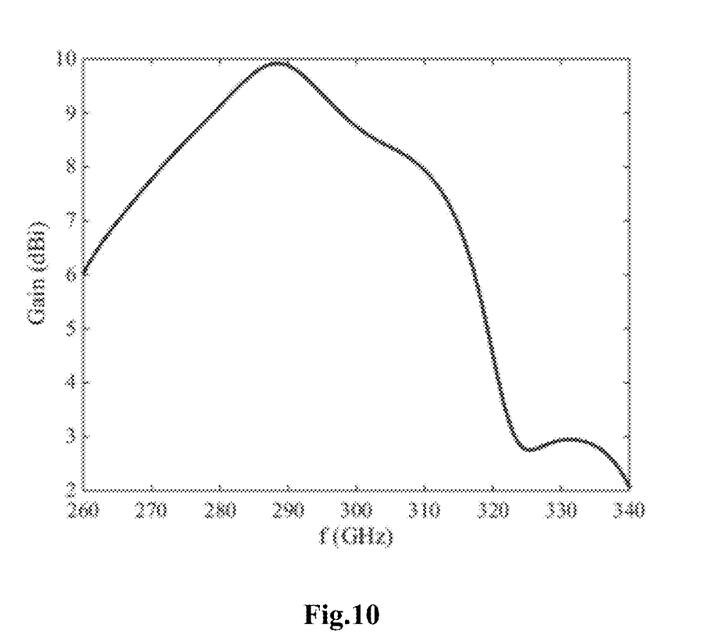
FIG. 10 is a graph showing the gain of a 2×2 on-chip dielectric resonant terahertz antenna array according to an embodiment of the present disclosure as a function of frequency.
Figure 11:
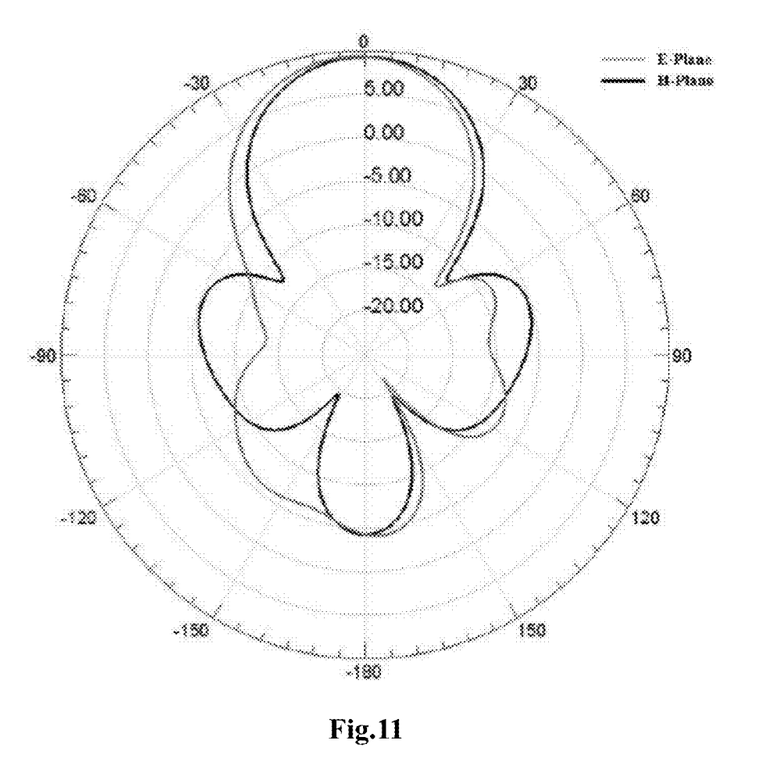
FIG. 11 is a radiation pattern of a 2×2 on-chip dielectric resonant terahertz antenna array according to an embodiment of the present disclosure.

5. Performing co-simulation and optimization of the 4-way GCPW power division network with the 2×2 on-chip dielectric resonant terahertz antenna array. The return loss S11 and the gain of the 2×2 on-chip dielectric resonant terahertz antenna array obtained by co-simulation as a function of frequency are shown in FIG. 9 and FIG. 10, respectively, where the impedance matching bandwidth of the 2×2 on-chip dielectric resonant terahertz antenna array at −10 dB is 20.1% (268-328 GHz), the peak gain of the on-chip dielectric resonant terahertz antenna is 9.91 dBi and the gain bandwidth at 3 dB is 16% (266-314 GHz). The radiation pattern of the 2×2 on-chip dielectric resonant terahertz antenna array is shown in FIG. 11, which has a narrower lobe width and better directivity, and its radiation efficiency is as high as 51%.

Therefore, the output voltage signal of the NMOSFET terahertz detector based on the 2×2 on-chip dielectric resonant terahertz antenna array according to the embodiment of the present disclosure is a DC voltage signal, and the magnitude of the DC voltage signal is proportional to the radiation intensity of the terahertz signal. The intensity information of the incident terahertz signal can be obtained according to the magnitude of the output voltage signal of the terahertz detector, thereby realizing terahertz detection.

The above is only a preferred embodiment of the present disclosure, which is not intended to limit the scope of the disclosure. All equivalent structural alterations made by using the disclosure of the present specification and drawings, or directly or indirectly utilized in other related technical fields, in the concept of the present disclosure, are encompassed within the scope of patent protection of the present disclosure.

What is claimed is:

1. A terahertz detector based on a N×M dielectric resonant antenna array, comprising a N×M on-chip dielectric resonant terahertz antenna array, wherein the N is the number of rows in the array, the M is the number of columns in the array and the N and the M are positive integers, wherein the N×M on-chip dielectric resonant terahertz antenna array is connected to a matching network, the matching network is connected to a source of a N-type Metal-Oxide-Semiconductor Field-Effect Transistor (NMOSFET), a gate of the NMOSFET is sequentially connected to a first bias resistor and a first bias voltage, a third transmission line is connected between the first bias resistor and the gate, a drain of the NMOSFET is connected to a first Direct Current (DC) blocking capacitor, the other end of the first DC blocking capacitor is connected to a low noise preamplifier, a second bias resistor and a second bias voltage are further connected between the first DC blocking capacitor and the low noise preamplifier, and the low noise preamplifier is further provided with a voltage feedback loop.

2. The terahertz detector of claim 1, wherein the N×M on-chip dielectric resonant terahertz antenna array is an array structure consisting of N×M on-chip H-shaped slot structures, each of the on-chip H-shaped slot structures is connected at the surface with a rectangular dielectric resonator block through an insulating adhesive layer, and a connection slot extending outwardly of each of the on-chip H-shaped slot structures is sequentially connected to the connection slots of adjacent on-chip H-shaped slot structures and form a non-overlapping power division network ring, the power division network ring being provided with two parallel antenna-sections connected to the outside.

3. The terahertz detector of claim 2, wherein when both the N and the M are even, a connection port of the connection slot of the uppermost on-chip H-shaped slot structure and a connection port of the connection slot of the lowermost on-chip H-shaped slot structure have a phase difference of 180°.

4. The terahertz detector of claim 3, wherein the on-chip H-shaped slot structures are formed on a surface of an integrated process top layer metal and is located within a metal cavity formed by stacking intermediate layer metals, other than the integrated process top layer metal and an integrated process bottom layer metal in an integrated process, and metal vias.

5. The terahertz detector of claim 4, wherein the on-chip H-shaped slot structure comprises a left vertical slot and a right vertical slot arranged in parallel, opposite sides of the left vertical slot and the right vertical slot are connected to an inverted L-shaped left side slot and right side slot, respectively, a horizontal portion of the left side slot is connected in the middle of the left vertical slot, a horizontal portion of the right side slot is connected in the middle of the right vertical slot, and vertical portions of the left side slot and the right side slot are parallel to each other and constitute two lead-out slots for connecting the antenna to an outside structure.

6. The terahertz detector of claim 1, wherein the matching network comprises a first transmission line connected to the on-chip dielectric resonant terahertz antenna and the source respectively at both ends, a middle portion of the first transmission line is connected to one end of a second transmission line, and the other end of the second transmission line is grounded.

7. The terahertz detector of claim 1, wherein the voltage feedback loop comprises a first resistor connected to two ends of the low noise preamplifier, a left end of the first resistor connected to a negative terminal of the low noise preamplifier is sequentially connected to a second resistor, a second DC blocking capacitor and the ground, and a right end of the first resistor is also sequentially connected to a third DC blocking capacitor and the ground.

8. A method of designing an N×M on-chip dielectric resonant terahertz antenna array, wherein the N is the number of rows in the array, the M is the number of columns in the array and the N and the M are positive integers, comprising:

S1: with a resonance mode being in $TE_{m,\delta,n}$ mode, calculating 3D dimensions of the rectangular dielectric resonator block by solving a transcendental equation, the transcendental equation being:

$$k_y \tan\left(\frac{k_y W_{DRA}}{2}\right) = \sqrt{(\varepsilon_r - 1)k_{mn}^2 - k_y^2}$$

wherein $$k_{mn} = \frac{2\pi f_{mn}}{c}, k_x = m\frac{\pi}{L_{DRA}}, k_z = n\frac{\pi}{2H_{DRA}}, k_x^2 + k_y^2 + k_z^2 = \varepsilon_r k_{mn}^2,$$

c is the speed of light, $\varepsilon_r$ is a relative dielectric constant and $f_{mn}$ is the operating frequency of the rectangular dielectric resonator block in said mode $TE_{m,\delta,n}$;

wherein m, n and δ are the number of electromagnetic waves generated in the x, y, z directions, and are integers;

wherein $k_y$ is the component of the propagation constant of electromagnetic waves in the medium in the y direction, and $k_{mn}$ is the propagation constant of electromagnetic waves in the medium, wherein $k_x$ and $k_z$ are the components of the propagation constant in the x and z directions when electromagnetic waves propagate in the medium;

wherein $W_{DRA}$ is the width of the medium in the x direction, $L_{DRA}$ is the length of the medium in the y direction, and $H_{DRA}$ is the height of the medium in the z direction;

S2: in a process of designing an on-chip excitation structure, selecting a top layer metal Metal6 to design a H-shaped slot structure while selecting a bottom layer metal Metal1 as a metal base plate, and stacking intermediate metal layers and metal vias to form a metal shielding cavity around the H-shaped slot structure;

S3: selecting a suitable insulating adhesive layer to combine the rectangular dielectric resonator block and the on-chip H-shaped slot structure;

S4: adopting a Grounded Coplanar Waveguide (GCPW) transmission line structure composed of the top layer metal Metal6 and the bottom layer metal Metal1 to design a power division network, and then optimizing parameters by means of High Frequency Structure Simulator (HFSS) software so as to meet impedance matching and port phase requirements of the GCPW power division network; and S5: performing co-simulation and optimization of the GCPW power division network with the N×M on-chip dielectric resonant terahertz antenna array.

9. The method of claim 8, wherein in the S1, the resonance mode of the rectangular dielectric resonator block is selected to be $TE_{m,\delta,n}$ mode of high-order resonant modes, and the transcendental equation is solved by programming with mathematical software Matlab, to obtain the 3D dimensions of the rectangular dielectric resonator block at a frequency of 300 GHz being $W_{DR}$=250 μm, $L_{DR}$=250 μm, $H_{DR}$=400 μm, respectively; in the S2, the dimensions of the H-shaped slot structure are $l_1$=70 μm, $l_2$=220 μm, $w_s$=9.5 μm, $w_1$=15 μm, $w_2$=10 μm, $w_3$=10 μm; and the insulating adhesive layer mentioned in the step S3 is selected as a thermal stability insulating adhesive having a relative dielectric constant $\varepsilon_r$ of 2.4 and a thickness of 10 μm.

* * * * *